US008865558B2

United States Patent
Park et al.

(10) Patent No.: US 8,865,558 B2
(45) Date of Patent: Oct. 21, 2014

(54) METHOD OF FORMING A PHASE CHANGE MATERIAL LAYER PATTERN AND METHOD OF MANUFACTURING A PHASE CHANGE MEMORY DEVICE

(75) Inventors: Jeong-Hee Park, Hwaseong-si (KR); Soon-Oh Park, Suwon-si (KR); Jung-Hwan Park, Seoul (KR); Jin-Ho Oh, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 5 days.

(21) Appl. No.: 13/543,905

(22) Filed: Jul. 9, 2012

(65) Prior Publication Data

US 2013/0017663 A1    Jan. 17, 2013

(30) Foreign Application Priority Data

Jul. 11, 2011 (KR) .......................... 10-2011-0068279

(51) Int. Cl.
*H01L 47/00* (2006.01)
*H01L 45/00* (2006.01)

(52) U.S. Cl.
CPC ............ *H01L 45/06* (2013.01); *H01L 45/1683* (2013.01); *H01L 45/141* (2013.01)
USPC ........... 438/382; 438/253; 438/396; 438/785; 257/310

(58) Field of Classification Search
USPC .................................. 438/382, 253, 396, 785
See application file for complete search history.

(56) References Cited

U.S. PATENT DOCUMENTS

| 6,319,367 | B1 * | 11/2001 | Coates et al. | 204/164 |
| 7,767,491 | B2 * | 8/2010 | Horii et al. | 438/102 |
| 8,039,353 | B2 * | 10/2011 | Dozen et al. | 438/381 |
| 2006/0027451 | A1 * | 2/2006 | Park et al. | 204/192.26 |
| 2006/0040485 | A1 * | 2/2006 | Lee et al. | 438/597 |
| 2007/0221906 | A1 * | 9/2007 | Hideki et al. | 257/2 |
| 2007/0246439 | A1 | 10/2007 | Lee et al. | |
| 2008/0247224 | A1 * | 10/2008 | Lung | 365/163 |
| 2010/0144135 | A1 * | 6/2010 | Kwon et al. | 438/597 |
| 2011/0031461 | A1 * | 2/2011 | Kang et al. | 257/3 |
| 2012/0273858 | A1 * | 11/2012 | Takahashi | 257/296 |

FOREIGN PATENT DOCUMENTS

| KR | 100729361 B1 | 6/2007 |
| KR | 1020090110405 A | 10/2009 |
| KR | 102010003662 A | 4/2010 |
| KR | 102010036622 A | 4/2010 |

* cited by examiner

*Primary Examiner* — Zandra Smith
*Assistant Examiner* — Damian A Hillman
(74) *Attorney, Agent, or Firm* — Volentine & Whitt, PLLC

(57) ABSTRACT

A method of forming a phase change material layer pattern includes forming a phase change material layer partially filling an opening through an insulating interlayer. A plasma treatment process is performed on the phase change material layer to remove an oxide layer on a surface of the phase change material layer. A heat treatment process is performed on the phase change material layer to remove a void or a seam in the phase change material layer, sufficiently filling the opening.

22 Claims, 12 Drawing Sheets

SECOND DIRECTION
⊗⟶ FIRST DIRECTION

SECOND DIRECTION
⊗⟶ FIRST DIRECTION

SECOND DIRECTION
⊗ ⟶ FIRST DIRECTION

THIRD DIRECTION
↑
⊗ ⟶ FIRST DIRECTION
SECOND DIRECTION

METHOD OF FORMING A PHASE CHANGE MATERIAL LAYER PATTERN AND METHOD OF MANUFACTURING A PHASE CHANGE MEMORY DEVICE

CROSS-REFERENCE TO RELATED APPLICATION

A claim of priority under 35 U.S.C. §119 is made to Korean Patent Application No. 10-2011-0068279, filed on Jul. 11, 2011, in the Korean Intellectual Property Office, the entire contents of which are hereby incorporated by reference.

BACKGROUND

The various embodiments discussed herein relate to methods of manufacturing phase change memory devices.

Generally, phase change memory devices record data based on the difference between resistance of a phase change material layer in an amorphous state and resistance of the phase change material layer in a crystalline state. A reset current transits the phase change material layer from the crystalline state to the amorphous state, and a set current transits the phase change material layer from the amorphous state to the crystalline state. The reset and set currents may be transferred from a transistor or a diode on a substrate to the phase change material layer through a lower electrode, enabling the phase transition of the phase change material layer to occur. That is, data is recorded using the phase transition of the phase change material layer, which may have a relatively high resistance in the amorphous state and a relatively low resistance in the crystalline state.

The phase change material layer may have a cylindrical shape and may be formed in an opening through an insulating interlayer. The material of the phase change material layer may not have good step coverage, in which case the phase change material layer may not entirely or sufficiently fill the opening, for example, leaving voids or seams. The phase change material layer may be exposed to a high temperature (e.g., much greater than about 400° C.) in a heat treatment process to attempt to address this, although exposure to the high temperature is potentially damaging to the phase change memory device and still may not successfully fill the opening.

SUMMARY

Various embodiments provide a method of manufacturing a phase change memory device having good gap-filling characteristics.

According to various embodiments, there is provided a method of forming a phase change material layer pattern. The method includes forming a phase change material layer partially filling an opening through an insulating interlayer; performing a plasma treatment process on the phase change material layer to remove an oxide layer on a surface of the phase change material layer; and performing a heat treatment process on the phase change material layer to remove a void or a seam in the phase change material layer, sufficiently filling the opening.

The phase change material layer may be maintained at a pressure below about $10^{-7}$ Torr between the plasma treatment process and the heat treatment process, preventing formation of another oxide layer on the phase change material layer.

The plasma treatment process may be performed in a different chamber than the heat treatment process is performed. Alternatively, the plasma treatment process and the heat treatment process may be performed in the same chamber.

The plasma treatment process may be performed using at least one gas selected from the group consisting of hydrogen (H), argon (Ar), neon (Ne), krypton (Kr) and xenon (Xe). The heat treatment process may performed using at least one gas selected from the group consisting of hydrogen (H), helium (He), argon (Ar), neon (Ne), krypton (Kr) and xenon (Xe) under a pressure of about 0.1 Torr to about 10 Torr. Also, the heat treatment process may be performed at a temperature of about 300° C. to about 400° C.

The phase change material layer may include at least one selected from the group consisting of tellurium (Te), selenium (Se), germanium (Ge), stibium (Sb), bismuth (Bi), lead (Pb), tin (Sn), arsenic (As), indium (In), sulfur (S), oxygen (O), palladium (Pd), platinum (Pt) and gold (Au). The phase change material layer may be doped with at least one selected from the group consisting of carbon (C), nitrogen (N), silicon (Si), oxygen (O), bismuth (Bi) and tin (Sn).

The method may further include planarizing an upper portion of the phase change material layer, using a top surface of the insulating interlayer as a polishing endpoint, after performing the heat treatment process.

According to various embodiments, there is provided a method of manufacturing a phase change memory device. The method includes forming a lower electrode on a substrate in a deposition chamber; forming an insulation layer on the substrate, the insulation layer having an opening exposing a top surface of the lower electrode; forming a phase change material layer on the exposed top surface of the lower electrode, the phase change material layer partially filling the opening; transferring the substrate from the deposition chamber to a heat treatment chamber at a pressure below about $10^{-7}$ Torr; performing a heat treatment process on the phase change material layer to remove a void or a seam in the phase change material layer and sufficiently filling the opening; and forming an upper electrode on the phase change material layer.

The method may further include forming a diode on the substrate prior to forming the lower electrode, the lower electrode being electrically connected to the diode.

The method may further include forming a transistor on the substrate prior to forming the lower electrode, the lower electrode being electrically connected to the transistor.

The method may further include forming a bit line electrically connected to the upper electrode, and forming a word line electrically connected to the lower electrode.

The method may further include performing a plasma treatment process on the phase change material layer after forming the phase change material layer. The plasma treatment process removes an oxide layer on a surface of the phase change material layer.

According to exemplary embodiments, a plasma treatment process may be performed to remove an oxide layer on a surface of a phase change material layer. A high vacuum state is maintained in a chamber to prevent formation of an additional oxide layer on the surface, so that a void or a seam may be removed by condensation or evaporation of the phase change material layer without a high temperature heat treatment. Therefore, the phase change material layer pattern free of voids and/or seams is easily formed.

According to exemplary embodiments, a method is provided for forming a phase change memory device. The method includes forming a phase change material layer on a lower electrode through an opening in an insulating interlayer, the phase change material layer containing at least one void or seam in the opening and having an oxide layer on a top surface; performing a plasma treatment process on the phase change material layer to remove the oxide layer from the top surface of the phase change material layer; and performing a heat treatment process on the phase change material layer at a temperature of about 300° C. to about 400° C. after the plasma treatment process, the heat treatment process removing the at least one void or seam in the phase change material layer.

BRIEF DESCRIPTION OF THE DRAWINGS

Illustrative embodiments will be more clearly understood from the following detailed description taken in conjunction with the accompanying drawings.

FIGS. 1 to 8 are cross-sectional views illustrating a method of manufacturing a phase change memory device in accordance with exemplary embodiments;

FIG. 9 is a cross-sectional view illustrating a phase change memory device in accordance with exemplary embodiments;

FIGS. 10 to 15 are cross-sectional views illustrating a method of manufacturing a phase change memory device in accordance with other exemplary embodiments; and FIGS. 16 to 23 are cross-sectional views illustrating a method of manufacturing a phase change memory device in accordance with other exemplary embodiments.

DETAILED DESCRIPTION OF THE EMBODIMENTS

Figure 1:
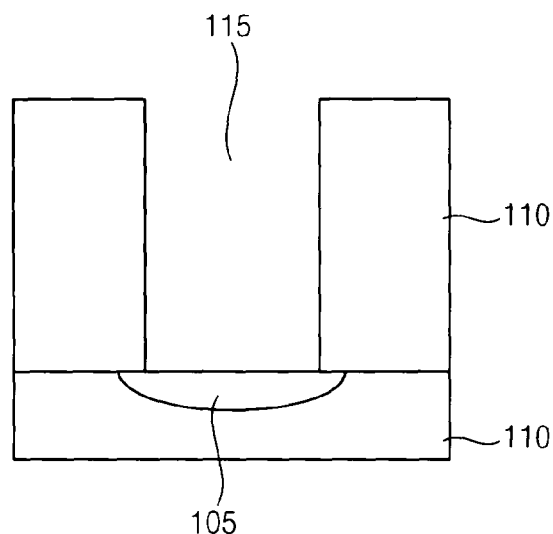
FIGS. 1 to 23 represent non-limiting, exemplary embodiments as described herein.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Also, the term "exemplary" is intended to refer to an example or illustration.

It will be understood that, although the terms first, second, third etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept. Also, lists of materials associated with various elements, components, regions and layers are intended to be merely exemplary, and not limiting.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized examples (and intermediate structures). As such, variations from the shapes of the illustrations as a result, for example, of manufacturing techniques and/or tolerances, are to be expected. Thus, exemplary embodiments should not be limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments will be explained in detail with reference to the accompanying drawings.

FIGS. 1 to 8 are cross-sectional views illustrating a method of manufacturing a phase change memory device, in accordance with exemplary embodiments.

Referring to FIG. 1, an impurity region 105 is formed at an upper portion of a substrate 100 by implanting first impurities having a first conductivity type. The substrate 100 may be a semiconductor substrate, e.g., a silicon substrate, a germanium substrate, a silicon-germanium substrate, a silicon-oninsulator (SOI) substrate, a germanium-on-insulator (GOI) substrate, etc. N-type or p-type impurities may be doped into the substrate 100.

A first insulating interlayer 110 is formed on the substrate 100 to cover the impurity region 105. For example, the first insulating interlayer 110 may be formed of silicon oxide, boron doped phosphorus silicate glass (BPSG), undoped silicate glass (USG), spin on glass (SOG), phosphorus doped silicate glass (PSG), tetra ethyl ortho silicate (TEOS), plasma-enhanced tetra ethyl ortho silicate (PE-TEOS), or the like. The first insulating interlayer 110 may be formed using a chemical vapor deposition (CVD) process, a low pressure chemical vapor deposition (LPCVD) process, a plasma enhanced chemical vapor deposition (PECVD) process, a high density plasma chemical vapor deposition (HDP-CVD) process, a physical vapor deposition (PVD) process, or the like.

A first opening 115 is formed through the first insulating interlayer 110 to expose at least a portion of the impurity region 105. More particularly, after forming a photoresist pattern (not shown) on the first insulating interlayer 110, the first insulating interlayer 110 is partially etched using the photoresist pattern as an etching mask, so that the first opening 115 is formed to expose the portion of the impurity region 105. After forming the first opening 115, the photoresist pattern is removed, for example, using an ashing process and/or a stripping process.

A silicon layer (not shown) is formed to fill the first opening 115 by a selective epitaxial growth (SEG) process using the exposed portion of the impurity region 105 as a seed. The silicon layer may include single crystalline silicon, amorphous silicon, polysilicon, etc. The silicon layer may partially fill the first opening 115.

Figure 2:
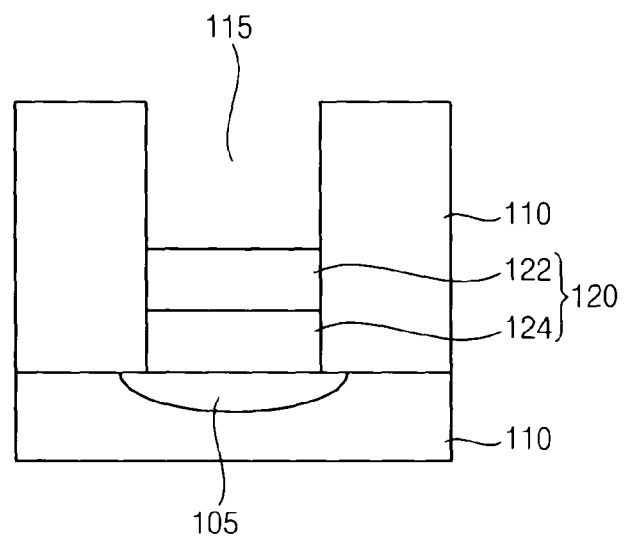

Referring to FIG. 2, a conductive structure 120, including an upper conductive layer pattern 122 and a lower conductive layer pattern 124, is formed by implanting impurities into an upper portion and a lower portion of the silicon layer, respectively. For example, the conductive structure 120 may serve as a diode. In exemplary embodiments, the upper conductive layer pattern 122 may be formed by implanting second impurities with a high concentration into the upper portion of the silicon layer, and the lower conductive layer pattern 124 may be formed by implanting third impurities with a low concentration into the lower portion of the silicon layer. The upper conductive layer pattern 122 may have a second conductivity type different from the first conductivity type, and the lower conductive layer pattern 124 may have a third conductivity type substantially the same as the first conductivity type. For example, when the first impurities are n-type, the second impurities may be p-type, and the third impurities may be n-type.

Figure 3:
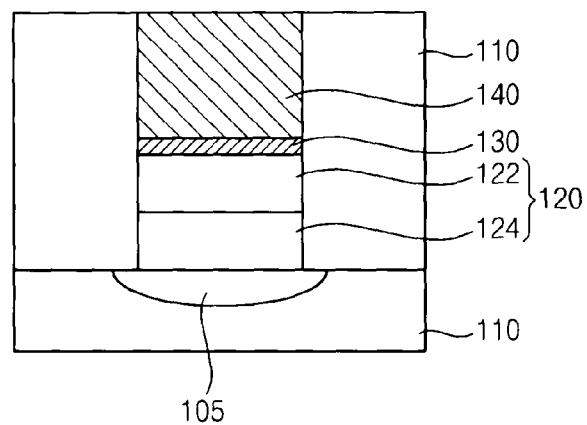

Referring to FIG. 3, an ohmic layer 130 is formed on the conductive structure 120. More particularly, the ohmic layer 130 is formed on the upper conductive layer pattern 122 of the conductive structure 120. The ohmic layer 130 may be formed of a metal silicide, such as tungsten silicide, titanium silicide, aluminum silicide, tantalum silicide, cobalt silicide, or the like. In various embodiments, a metal layer may be formed on the conductive structure 120 using an atom layer deposition (ALD) process, a CVD process, a sputtering process, or the like, and a silicidation process may be performed on the metal layer to form the ohmic layer 130.

Further, a lower electrode layer may be formed on the ohmic layer 130 and the first insulating interlayer 110 to fill the first opening 115, and an upper portion of the lower electrode layer is planarized until a top surface of the first insulating interlayer 110 is exposed, forming a lower electrode 140 that fills a remaining portion of the first opening 115. The lower electrode layer may be formed of a metal, a conductive metal nitride or a conductive silicon nitride, for example, using an ALD process, a CVD process, a sputtering process, or the like. In various embodiments, the lower electrode layer may have a multi-layered structure, e.g., a metal layer/a metal nitride layer or a metal layer/a metal silicon nitride layer.

Figure 4:
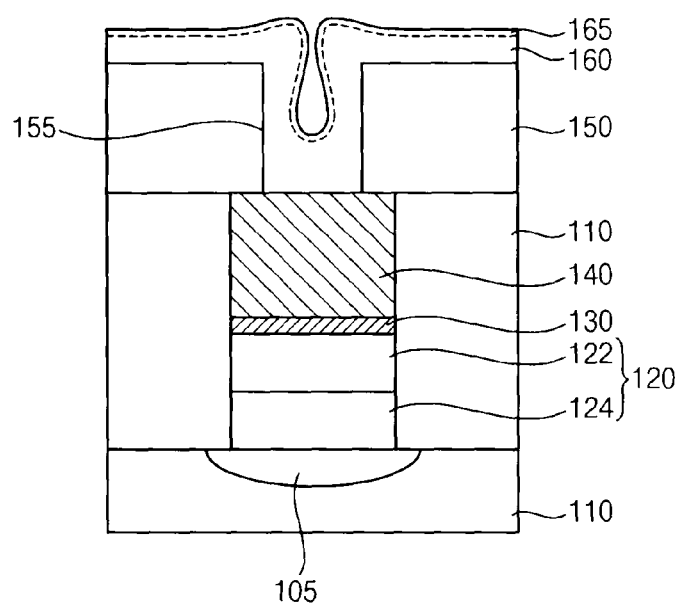

Referring to FIG. 4, a second insulating interlayer 150 is formed on the lower electrode 140 and the first insulating interlayer 110. The second insulating interlayer 150 may be formed using a silicon oxide, such as BPSG, USG, SOG, PSG, TEOS, PE-TEOS, or the like.

Further, a second opening 155 is formed through the second insulating interlayer 150 to expose at least a portion of the lower electrode 140. A phase change material layer 160 is formed on the exposed portion of the lower electrode 140 and the second insulating interlayer 150 to partially fill the second opening 155. The phase change material layer 160 may be formed of a chalcogenide compound, for example, using a CVD process, an LPCVD process, a PECVD process, an HDP-CVD process, an ALD process, a sputtering process, or the like. The chalcogenide compound may include tellurium (Te), selenium (Se), germanium (Ge), stibium (Sb), bismuth (Bi), lead (Pb), tin (Sn), arsenic (As), indium (In), sulfur (S), oxygen (O), palladium (Pd), platinum (Pt), or gold (Au), for example, which may be used alone or in various combinations thereof. For example, the chalcogenide compound may include Ge—Te, Ge—Sb—Te, Ge—Te—Se, Ge—Te—As, Ge—Te—Sn, Ge—Te—Ti, Ge—Bi—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, or In—Sb—Te.

In various embodiments, impurities may be implanted into the phase change material layer 160. The impurities may include carbon (C), nitrogen (N), silicon (Si), oxygen (O), bismuth (Bi), or tin (Sn), for example, which may be used alone or in various combinations thereof. For example, the phase change material layer 160 may be formed using Ge—Sb—Te doped with impurities including nitrogen and carbon. The deposition process of the phase change material layer 160 and the doping process of the impurities may be performed in-situ. One or more materials of the phase change material layer 160 may not have good step coverage, so that a void or a seam may be formed in the phase change material layer 160 in the second opening 155 of the second insulating interlayer 150, as shown in FIG. 4.

An upper portion of the phase change material layer 160 may be oxidized, forming an oxide layer 165 on the surface of the phase change material layer 160. For example, when the phase change material layer 160 includes Ge—Sb—Te (GST), the oxide layer 165, which may include germanium oxide (GeO) or antimony oxide (SbO), for example, is formed on the phase change material layer 160 by a reaction between the phase change material layer 160 and oxygen. The oxide layer 165 may be formed by oxidation of the phase change material layer 160 at a low vacuum state in a deposition chamber, for example. Further, the oxide layer 165 may be formed by oxidation of the phase change material layer 160 when the substrate 100 is transferred from the deposition chamber into a heat treatment chamber.

Figure 5:
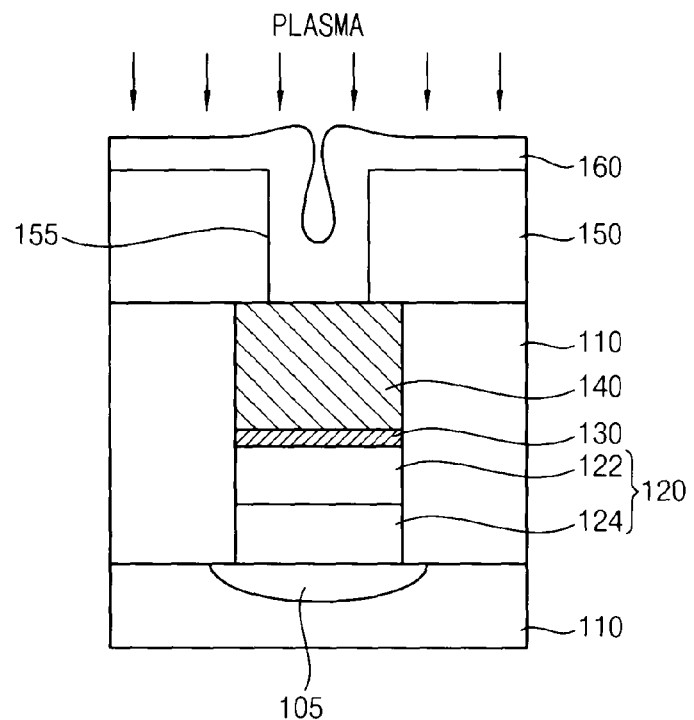

Referring to FIG. 5, the oxide layer 165 is removed by performing a plasma treatment process on the phase change material layer 160, for example. The plasma treatment process may include a radio frequency (RF) plasma treatment using hydrogen (H) gas and an inert gas, such as argon (Ar), neon (Ne), krypton (Kr), xenon (Xe), for example. In various embodiments, the RF plasma treatment may be performed using an RF bias below about 300 W and a plasma power of about 100 W to about 600 W. For example, the RF plasma treatment may be performed using hydrogen gas and argon gas under a pressure of about 1 mTorr to about 100 mTorr.

Figure 6:
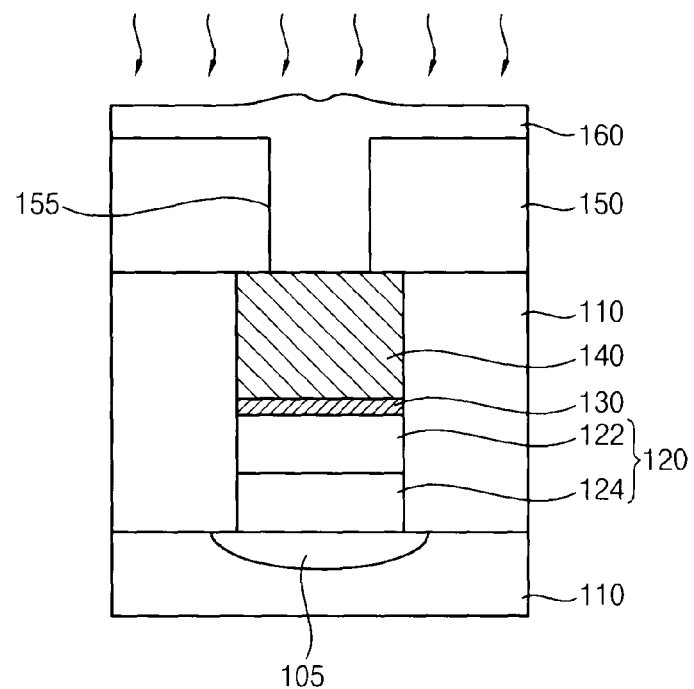

Referring to FIG. 6, the void or seam is removed using a heat treatment process, so that the phase change material layer 160 sufficiently fills the second opening 155, meaning that the phase change material layer 160 within the second opening 155 is substantially free of voids or seams. In various embodiments, the heat treatment process may include a rapid thermal process (RTP) and a rapid thermal nitridation process (RTN), for example. The heat treatment process may be performed using hydrogen gas and an inert gas, such as He, Ar, Ne, Kr, Xe, or the like, under a pressure of about 0.1 Torr to about 10 Torr at a temperature of about 300° C. to about 400° C., for example.

When an oxide layer, e.g., including GeO or SbO, is formed on a surface of the phase change material layer 160, the oxide layer may be stable so that reflow of the phase change material layer 160 is relatively difficult. Thus, removing the void or seam is likewise difficult, even when the heat treatment process is performed on the phase change material layer 160 at a high temperature. However, according to various embodiments, the oxide layer on the surface of phase change material layer 160 is removed using the plasma treatment process. Therefore, the materials of the phase change material layer 160 easily move by condensation and evaporation of the phase change material layer 160 on a surface thereof during the heat treatment process. Thus, the void or seam is easily removed without a high temperature heat treatment process. Additionally, as the heat treatment process is performed under a high pressure of an inert gas, heat may be distributed to the phase change material layer 160 sufficiently and uniformly, so that the reflow of the phase change material layer 160 is effective.

In various embodiments, after the plasma treatment process, the substrate 100 may be transferred from a plasma treatment chamber into a heat treatment chamber in a high vacuum state, for example, under a pressure below about $10^{-7}$ Torr. This prevents additional formation of a natural oxide layer due to reaction between the phase change material layer 160 and oxygen in the air and/or the chambers. The heat treatment process may then be efficiently performed in the heat treatment chamber, without the presence of an oxide layer.

In various embodiments, the heat treatment process may be performed in a chamber substantially the same as a chamber in which the plasma treatment process is performed. In this case, the oxide layer 165 on the surface of the phase change material layer 160 may be removed by the plasma treatment process, and a heat treatment process may be preformed immediately, preventing additional formation of a natural oxide layer on the surface of the phase change material layer 160.

Figure 7:
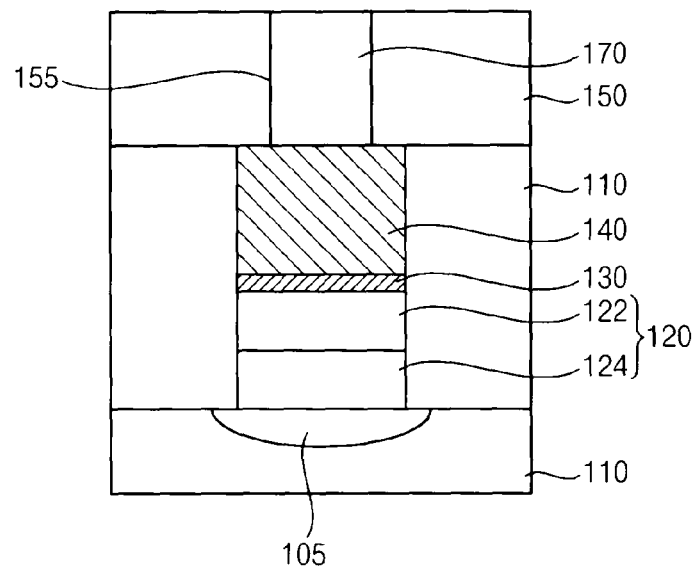

Referring to FIG. 7, an upper portion of the phase change material layer 160 is planarized until a top surface of the second insulating interlayer 150 is exposed, forming a phase change material layer pattern 170. The planarizing process may include a chemical mechanical polishing (CMP) process or an etch-back process, for example.

Figure 8:
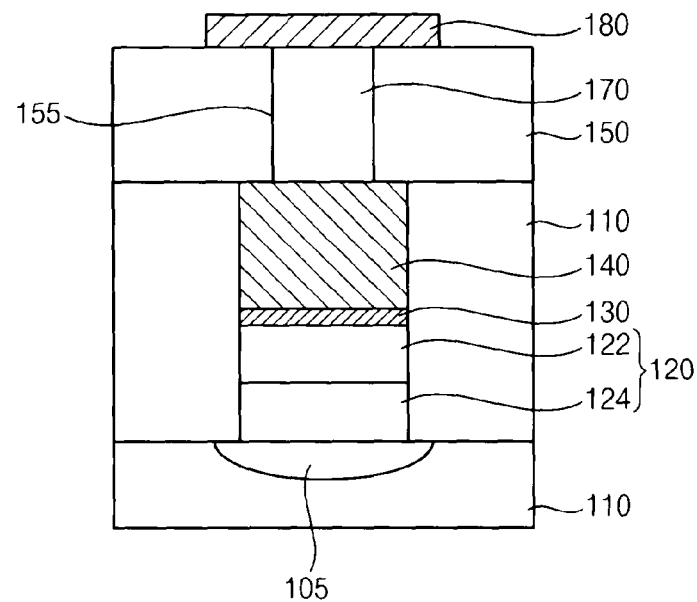

Referring to FIG. 8, a conductive layer is formed on the second insulating interlayer 150 and the phase change material layer pattern 170, and the conductive layer is patterned to form an upper electrode 180 electrically connected to the phase change material layer pattern 170. The conductive layer may be formed of titanium nitride, tantalum nitride, molybdenum nitride, niobium nitride, titanium silicon nitride, titanium aluminum nitride, titanium boron nitride, zirconium silicon nitride, tungsten, tungsten nitride, conductive carbon, carbon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxynitride, titanium aluminum oxynitride, tungsten oxynitride, or tantalum oxynitride, for example. The conductive layer may be formed using a CVD process, a PVD process, an ALD process, or the like.

Performing the afore-mentioned processes enables manufacturing of the phase change memory device, according to various embodiments. Generally, the oxide layer 165 formed on the surface of the phase change material layer 160 is removed using a plasma treatment process, and the high vacuum state is maintained to prevent formation of an another oxide layer, so that the void or the seam in the phase change material layer 160 is easily removed by condensation on the surface of the phase change material layer 160 without a high temperature heat treatment process.

Figure 9:
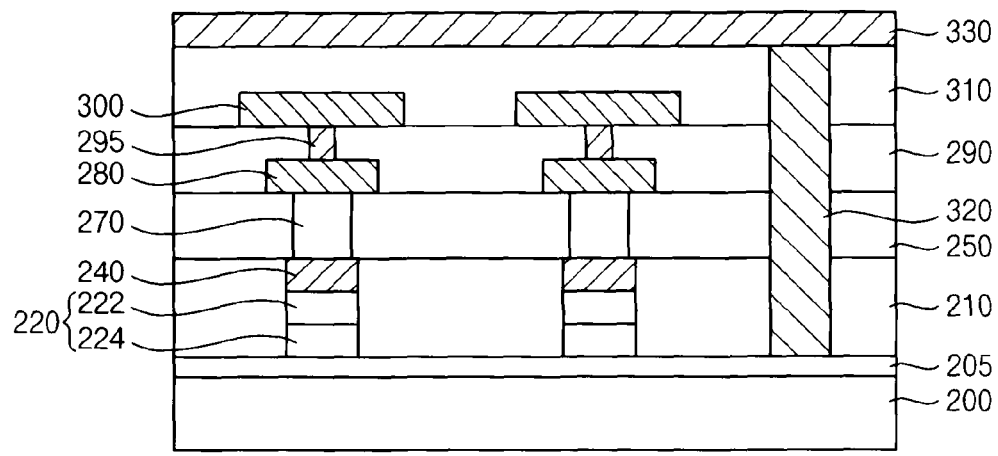

FIG. 9 is a cross-sectional view illustrating a phase change memory device in accordance with exemplary embodiments.

Referring to FIG. 9, the phase change memory device includes a conductive structure 220, a lower electrode 240, a phase change material layer pattern 270, an upper electrode 280, and first and second wirings 300 and 330 sequentially stacked on a substrate 200.

The substrate 200 may be a semiconductor substrate, such as a silicon substrate, a germanium substrate, a silicon-germanium substrate, a silicon-on-insulator (SOI) substrate, a germanium-on-insulator (GOI) substrate, or the like. An impurity region 205 doped with first impurities extends in a first direction. For example, the impurity region 205 may have a first conductivity type, such as n-type. In exemplary embodiments, multiple impurity regions 205 are disposed in a second direction substantially perpendicular to the first direction.

The conductive structure 220 includes an upper conductive layer pattern 222 doped with a high concentration of second impurities and a lower conductive layer pattern 224 doped with a low concentration of third impurities. According to exemplary embodiments, the second impurities may have a second conductivity type, such as p-type, and the third impurities may have a third conductivity type, such as n-type. The conductive structure 220 may serve as a diode, for example.

A first insulating interlayer 210 having a first opening exposing at least a portion of the impurity region 205 is disposed on the substrate 200. The conductive structure 220 fills a lower portion of the first opening, and is disposed on the exposed portion of the impurity region 205. The first insulating interlayer 210 may include an oxide, such as silicon oxide, for example.

The lower electrode 240 is disposed on the conductive structure 220, filling a remaining portion of the first opening in the first insulating interlayer 210. The lower electrode 240 may include a metal, a metal nitride or a metal silicon nitride, for example. The lower electrode 240 may be a multi-layered structure, containing at least one metal layer, at least one metal nitride layer and/or at least one metal silicon nitride layer, for example. Further, an ohmic layer (not shown) may be disposed between the conductive structure 220 and the lower electrode 240.

A second insulating interlayer 250 having a second opening exposing the lower electrode 240 is disposed on the first insulating interlayer 210. The second insulating interlayer 250 may include a material having an etch selectivity with respect to the first insulating interlayer 210 or a material substantially the same as that of the first insulating interlayer 210. For example, the second insulating interlayer 250 may include silicon nitride, silicon oxy-nitride, silicon oxide, or the like.

The phase change material layer pattern 270 contacting the lower electrode 240 is disposed in the second opening in the second insulating interlayer 250. The phase change material layer pattern 270 may include a chalcogenide compound, for example, such as a GST compound including Ge—Sb—Te or a GST compound doped with carbon, nitrogen and/or a metal. As discussed above, the phase change material layer pattern 270 does not have voids or seams therein, so that the phase change memory device has desired electrical characteristics.

The upper electrode 280 is disposed on the phase change material layer pattern 270, and may include a metal nitride. In exemplary embodiments, the upper electrode 280 includes a first upper electrode layer pattern (not shown) and a second upper electrode layer pattern (not shown) sequentially stacked on the phase change material layer pattern 270 and the second insulating interlayer 250. In this case, the first upper electrode layer pattern may include a metal, and the second upper electrode layer pattern may include a conductive metal nitride, for example.

A third insulating interlayer 290 is disposed on the second insulating interlayer 250, covering the upper electrode 280. The third insulating interlayer 290 may include a silicon oxide, such as BPSG, PSG, USG, SOG, FOX, TEOS, PE-TEOS or HDP-CVD oxide, for example.

A first plug 295 for electrically connecting the upper electrode 280 with the first wiring 300 is disposed in the third insulating interlayer 290. The first wiring 300 extends in the second direction. Each of the first wiring 300 and the first plug 295 may include a metal, a conductive metal nitride or polysilicon doped with impurities, for example. In exemplary embodiments, the first wiring 300 may serve as a bit line.

A fourth insulating interlayer 310 is disposed on the third insulating interlayer 290, covering the first wiring 300. The fourth insulating interlayer 310 may include a silicon oxide, such as BPSG, PSG, USG, SOG, FOX, TEOS, PE-TEOS or HDP-CVD oxide, for example.

The second wiring 330 is disposed on the fourth insulating interlayer 310, and is electrically connected to a portion of the substrate 200 through a second plug 320. The second plug 320 is disposed through the first to fourth insulating interlayers 210, 250, 290 and 310 to contact the substrate 200. The second wiring 330 extends in the first direction. The second wiring 330 and the second plug 320 may include polysilicon doped with impurities, a metal or a metal nitride, for example. In exemplary embodiments, the second wiring 330 may serve as a word line.

The phase change material layer pattern 270 of the phase change memory device has no viods and/or seams therein. The phase change memory device thereby has desired electrical characteristics.

FIGS. 10 to 15 are cross-sectional views illustrating a method of manufacturing a phase change memory device, in accordance with exemplary embodiments. For example, FIGS. 10 to 15 illustrate a method of manufacturing the phase change memory device illustrated in FIG. 9, and the method described with reference to FIGS. 10 to 15 may be substantially the same as or similar to the method described with reference to FIGS. 1 to 8. Therefore, detailed explanations about the same or similar processes may not be repeated here.

Figure 10:
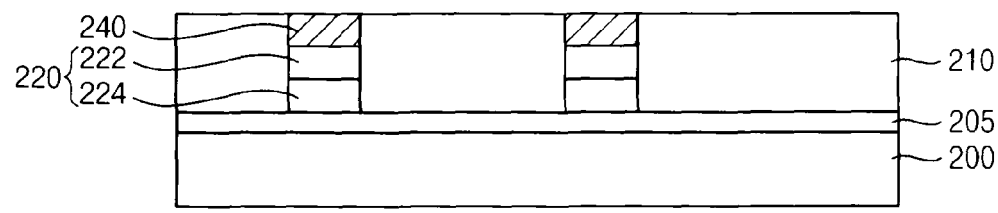

Referring to FIG. 10, first impurities are implanted into an upper portion of a substrate 200 to form an impurity region 205. A first insulating interlayer 210 is formed on the substrate 200 to cover the impurity region 205. In exemplary embodiments, the impurity region 205 extends in a first direction, and multiple impurity regions 205 are formed in a second direction.

The first insulating interlayer 210 is partially etched to form a first opening exposing at least a portion of the impurity region 205. A silicon layer may be formed to fill the first opening by performing a selective epitaxial growth (SEG) process, for example, using the exposed portion of the impurity region 205 as a seed.

The silicon layer is partially removed to form a silicon layer pattern partially filling the first opening. Second impurities are implanted into an upper portion of the silicon layer pattern to form an upper conductive layer pattern 222, and third impurities are implanted into a lower portion of the silicon layer pattern to form a lower conductive layer pattern 224. The upper conductive layer pattern 222 and the lower conductive layer pattern 224 form a conductive structure 220 filling a lower portion of the first opening.

A lower electrode layer is formed on the first insulating interlayer 210 to sufficiently fill the remaining portion of the first opening. The lower electrode layer is planarized until a top surface of the first insulating interlayer 210 is exposed, so that a lower electrode 240 is formed in the remaining portion of the first opening.

Figure 11:
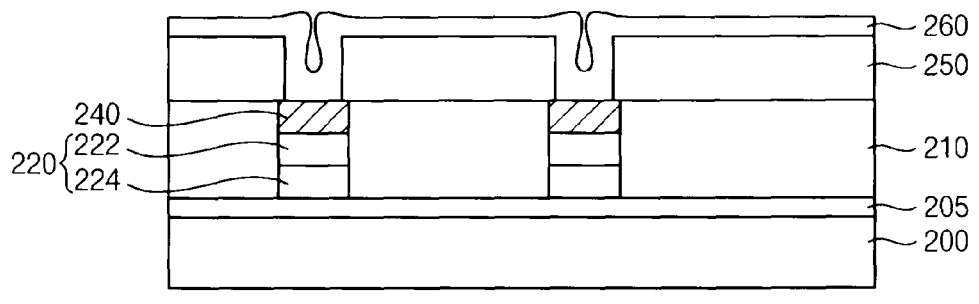

Referring to FIG. 11, a second insulating interlayer 250 is formed on the first insulating interlayer 210. The second insulating interlayer 250 has a second opening exposing the lower electrode 240.

A phase change material layer 260 is formed on the second insulating interlayer 250 to partially fill the second opening. The phase change material layer 260 may be formed using a chalcogenide compound, for example. In exemplary embodiments, one or more impurities such as carbon, nitrogen, silicon, oxygen, bismuth, tin and the like, may be implanted into the phase change material layer 260. The deposition process of the phase change material layer 260 and the doping process of the impurities may be performed in-situ.

In exemplary embodiments, before forming the phase change material layer 260, the pressure in a deposition chamber may be maintained at a high vacuum state, for example, below about $10^{-7}$ Torr, in order to remove remaining oxygen in the deposition chamber. Thus, the phase change material layer 260 may be formed after removing the remaining oxygen in the deposition chamber, preventing an oxide layer, such as germanium oxide or antimony oxide, from forming on the surface of the phase change material layer 260.

One or more materials of the phase change material layer 260 may not have good step coverage. Therefore, a void or a seam may be formed in the phase change material layer 260 in the second opening of the second insulating interlayer 250 during the deposition process.

Figure 12:
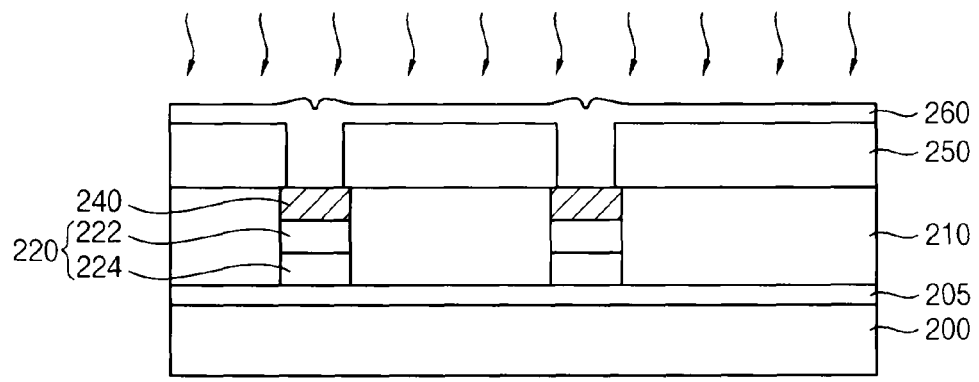

Referring to FIG. 12, a heat treatment process is performed on the phase change material layer 260 to remove the void or the seam, thus sufficiently filling the second opening. In exemplary embodiments, the heat treatment process may be performed using an inert gas, such as He, Ar, Ne, Kr, Xe, or the like, under pressure of about 0.1 Torr to about 10 Torr at a temperature of about 300° C. to about 400° C., for example. Additionally, as described with reference to FIG. 5 above, a plasma treatment process may be further performed on the phase change material layer 260 to remove the oxide layer (e.g., oxide layer 165).

In exemplary embodiments, after forming the phase change material layer 260, the substrate 200 may be transferred from the deposition chamber into a heat treatment chamber in a high vacuum state, for example, a pressure below about $10^{-7}$ Torr. Therefore, an oxide layer is not formed on the surface of the phase change material layer 260. In other exemplary embodiments, the heat treatment process may be performed in a chamber the same or substantially the same as that in which the deposition process of the phase change material layer 260 is performed. Therefore, an oxide layer is not formed on the surface of the phase change material layer 260.

Figure 13:
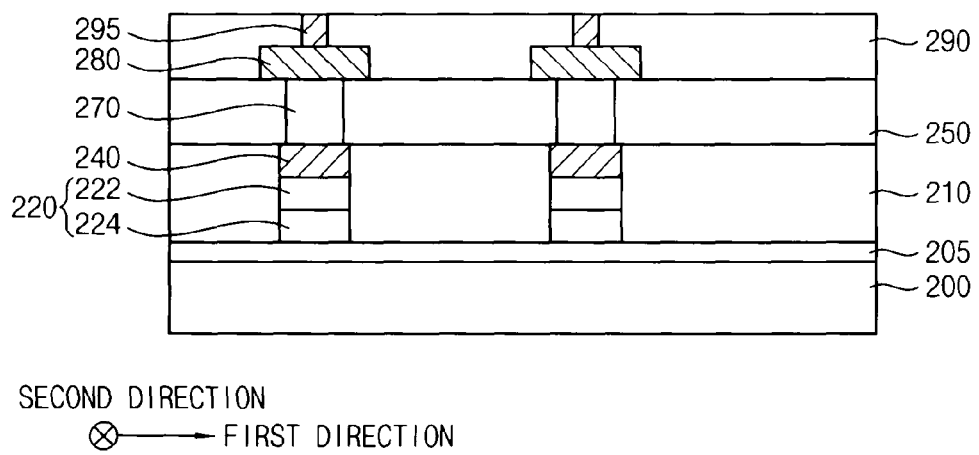

Referring to FIG. 13, the phase change material layer 260 is planarized until a top surface of the second insulating interlayer 250 is exposed, forming a phase change material pattern 270. The planarization process may include an etch back process or a CMP process, for example.

A conductive layer is formed on the second insulating interlayer 250 and the phase change material pattern 270. The conductive layer is patterned to form an upper electrode 280. A third insulating interlayer 290 is formed on the second insulating interlayer 250, covering the upper electrode 280. A third opening is formed in the third insulating interlayer 290 to expose the upper electrode 280. A first plug 295 is formed on the upper electrode 280, filling the remainder of the third opening.

Figure 14:
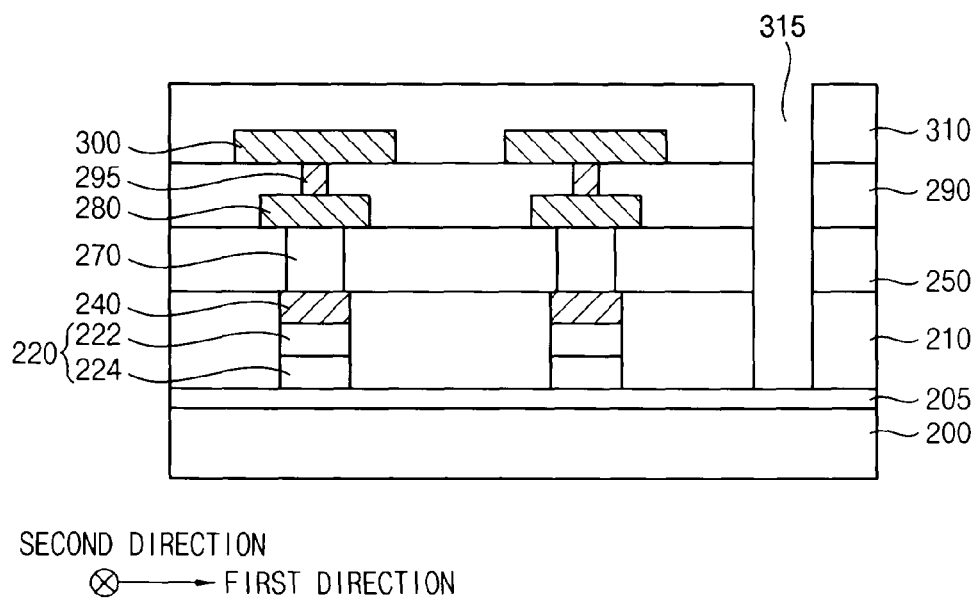

Referring to FIG. 14, first wiring 300 is formed on the first plug 295 and the third insulating interlayer 290. In exemplary embodiments, the first wiring 300 extends in the second direction, and may serve as a bit line, for example.

A fourth insulating interlayer 310 is formed on the third insulating interlayer 290, covering the first wiring 300. A fourth opening 315 is formed through the first to fourth insulating interlayers 210, 250, 290 and 310 to expose a portion of the substrate 200.

Figure 15:
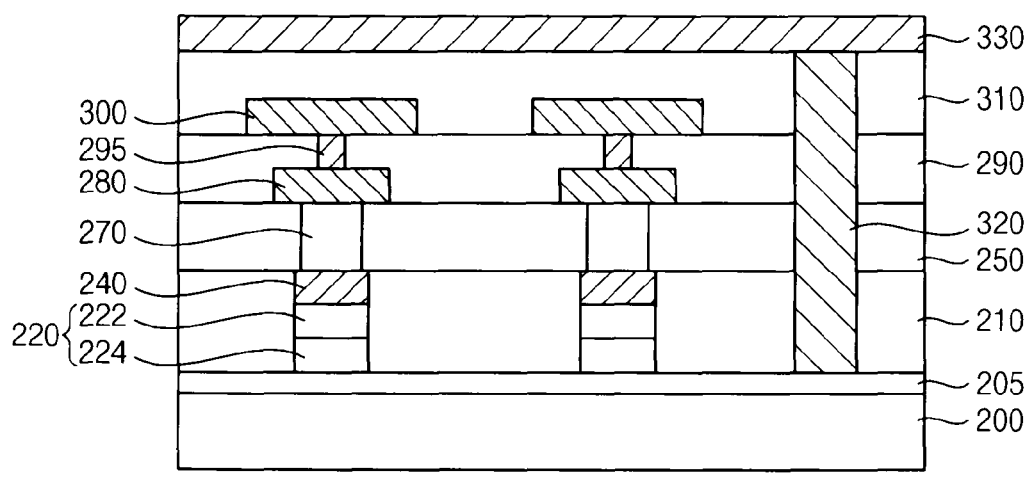

Referring to FIG. 15, a second plug 320 is formed on the substrate 200, filling the fourth opening 315. Second wiring 330 contacting the second plug 320 is formed on the fourth insulating interlayer 310. In exemplary embodiments, the second wiring 330 extends in the first direction, and may serve as a word line, for example.

In the method of fabricating the phase change memory device described above, the phase change material layer 260 may be formed after removing the remaining oxide layer in the deposition chamber, and the substrate 200 may be transferred from the deposition chamber into the heat treatment chamber in a high vacuum state, for example, at a pressure below about $10^{-7}$ Torr, so that another oxide layer does not form on the surface of the phase change material layer 260. Therefore, the void or the seam formed in the phase change material layer 260 may be removed in the heat treatment chamber by condensation of the phase change material layer 260 on a surface thereof without use of a high temperature heat treatment. Accordingly, the phase change material layer pattern 270 is easily formed with no voids and/or seams.

FIGS. 16 to 23 are cross-sectional views illustrating a method of manufacturing a phase change memory device in accordance with exemplary embodiments. The method described with reference to FIGS. 16 to 23 may be substantially the same as the method described with reference to FIGS. 10 to 15, except that a transistor may be formed instead of a diode. Detailed explanations about the same or similar processes may not be repeated.

Figure 16:
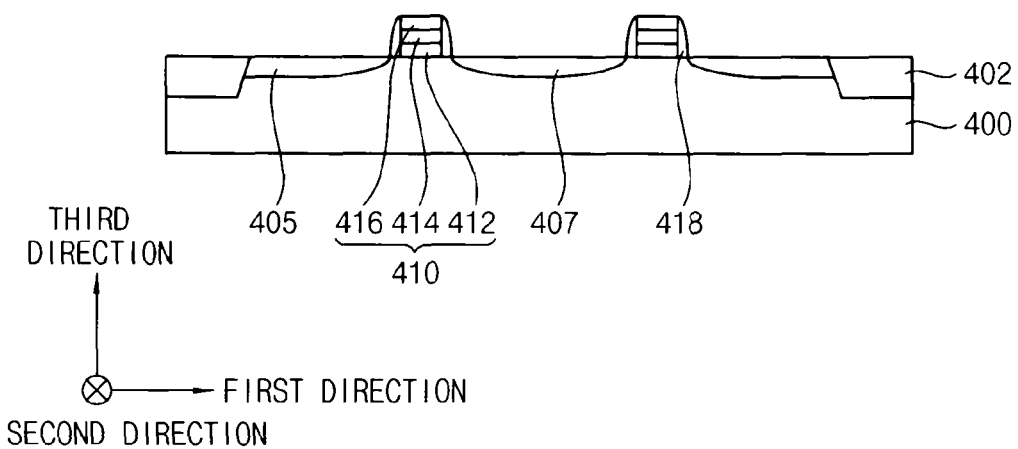

Referring to FIG. 16, an isolation layer structure 402 is formed on a substrate 400 to define an active region and a field region in the substrate 400. The isolation layer structure 402 may be formed by a shallow trench isolation (STI) process or a thermal oxidation process, for example.

After forming a gate insulation layer, a gate conductive layer and a gate mask layer sequentially on the substrate 400, the gate insulation layer, the gate conductive layer and the gate mask layer are patterned to form a gate structure 410 on the substrate 400 in the active region. The gate structure 410 includes gate insulation layer pattern 412, gate electrode 414 and gate mask 416 sequentially stacked on the substrate 400. A nitride layer is formed on the substrate 400 to cover the gate structure 410. The nitride layer may be etched anisotropically to form a gate spacer 418 on a sidewall of the gate structure 410.

A first impurity region 405 and a second impurity region 407 are formed at upper portions of the substrate 400 in the active region adjacent to the gate structure 410 by performing an ion implantation process using the gate structure 410 and the gate spacer 418 as an ion implantation mask. Therefore, a transistor is formed in the active region, the transistor including the gate structure 410 and the first and second impurity regions 405 and 407. In exemplary embodiments, the transistor may serve as a switching element for driving a phase change memory unit in the phase change memory device, for example.

Figure 17:
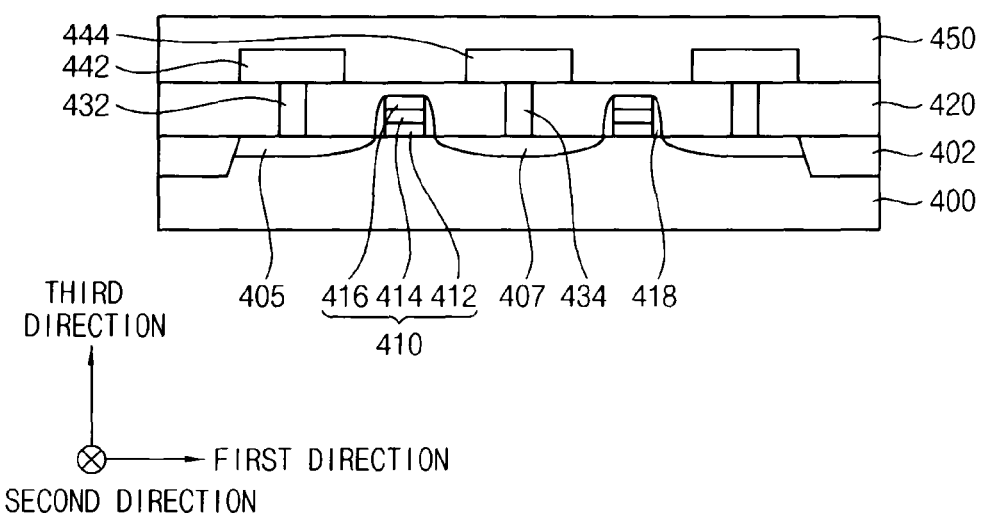

Referring to FIG. 17, a first insulating interlayer 420 is formed on the substrate 400 to cover the transistor. The first insulating interlayer 420 may be formed using a silicon oxide, such as BPSG, USG, SOG, PSG, TEOS, PE-TEOS, or the like. The first insulating interlayer 420 is partially etched to form a first contact hole and a second contact hole through the first insulating interlayer 420. The first contact hole and the second contact hole expose the first impurity region 405 and the second impurity region 407, respectively. The first and second contact holes may be formed by a photolithography process, for example.

A first conductive layer is formed on the first insulating interlayer 420 to sufficiently fill the first and second contact holes. The first conductive layer may be formed using a metal and/or a metal nitride, for example. The first conductive layer is partially removed until a top surface of the first insulating interlayer 420 is exposed, so that a first contact 432 and a second contact 434 are formed to fill the first contact hole and the second contact hole, respectively. The first contact 432 and the second contact 434 are formed on the first impurity region 405 and the second impurity region 407, respectively. The first and second contacts 432 and 434 may be formed by a CMP process or an etch-back process, for example.

A second conductive layer is formed on the first and second contacts 432 and 434 and the first insulating interlayer 420 using a metal, a metal nitride or polysilicon doped with impurities, for example. The second conductive layer is patterned to form a pad 442 and first wiring 444 on the first contact 432 and the second contact 434, respectively. In exemplary embodiments, the first wiring 444 may serve as a bit line, for example.

A second insulating interlayer 450 is formed on the first insulating interlayer 420 to cover the pad 442 and the first wiring 444. For example, the second insulating interlayer 450 may be formed using a silicon oxide, such as BPSG, USG, SOG, PSG, TEOS, PE-TEOS, or the like, using a CVD process, an ALD process, a sputtering process, or the like.

Figure 18:
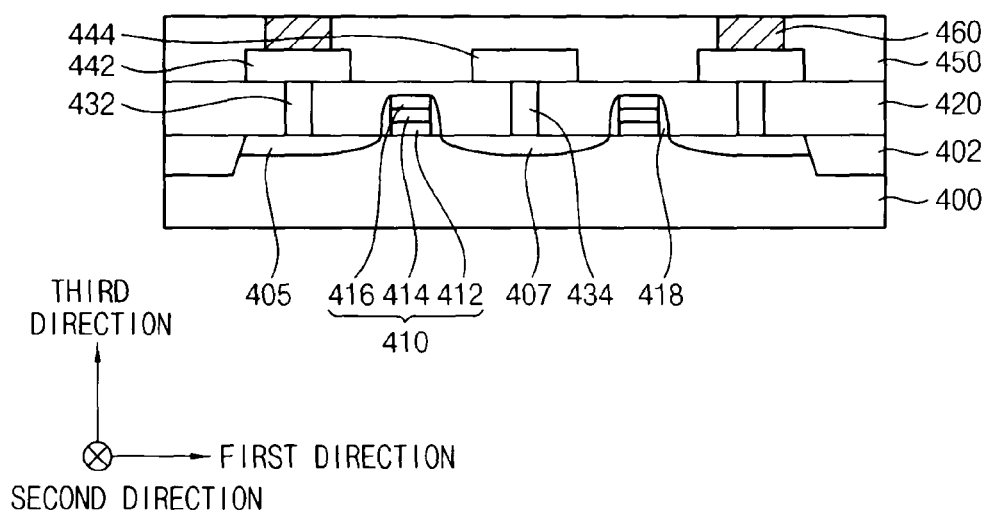

Referring to FIG. 18, the second insulating interlayer 450 is partially etched to form a first opening exposing a portion of the pad 442. In exemplary embodiments, multiple first openings are formed, where the first openings are spaced apart from each other at a predetermined distance in the first and second directions substantially parallel to a top surface of the substrate 400.

A lower electrode layer is formed on the exposed portion of the pad 442 and the second insulating interlayer 450 to fill the first opening. The lower electrode layer is planarized until a top surface of the second insulating interlayer 450 is exposed to form a lower electrode 460. The lower electrode layer may be formed using a metal, a metal nitride, or polysilicon doped with impurities, for example.

An ohmic layer (not shown) may be further formed between the pad 442 and the lower electrode 460. The ohmic layer may be formed using a metal silicide, for example, such as tungsten silicide, cobalt silicide, titanium silicide, tantalum silicide, aluminum silicide, or the like.

Figure 19:
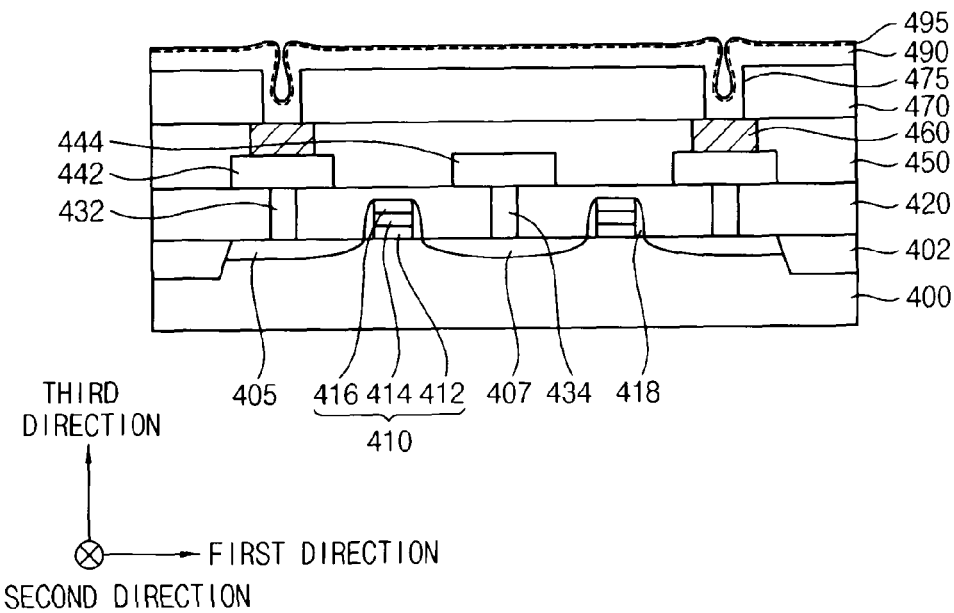

Referring to FIG. 19, a third insulating interlayer 470 is formed on the second insulating interlayer 450 and the lower electrode 460. The third insulating interlayer 470 is partially etched to form a second opening 475 exposing the lower electrode 460.

A phase change material layer 490 is formed on the third insulating interlayer 470, partially filling the second opening 475. The phase change material layer 490 may be formed using a chalcogenide compound, for example. In exemplary embodiments, impurities, such as carbon, nitrogen, silicon, oxygen, bismuth, tin, or the like, may be doped into the phase change material layer 490. The deposition process of the phase change material layer 490 and the doping process of the impurities may be performed in-situ.

Materials of the phase change material layer 490 may not have good step coverage. Therefore, a void or a seam may be formed in the phase change material layer 490 when the phase change material layer 490 is formed in the second opening 475.

Also, an upper portion of the phase change material layer 490 may be oxidized, such that an oxide layer 495 forms on a surface of the phase change material layer 490. For example, when the phase change material layer 490 includes Ge—Sb—Te (GST), the oxide layer 495, including germanium oxide (GeO), antimony oxide (SbO), or the like, may be formed on the phase change material layer 490 by reaction between the phase change material layer 490 and oxygen. The oxide layer 495 may be formed, for example, by oxidation of the phase change material layer 490 at a low vacuum state in a deposition chamber. In addition, an oxide layer may be formed by oxidation of the phase change material layer 490 when the substrate 400 is transferred from the deposition chamber into a heat treatment chamber.

Figure 20:
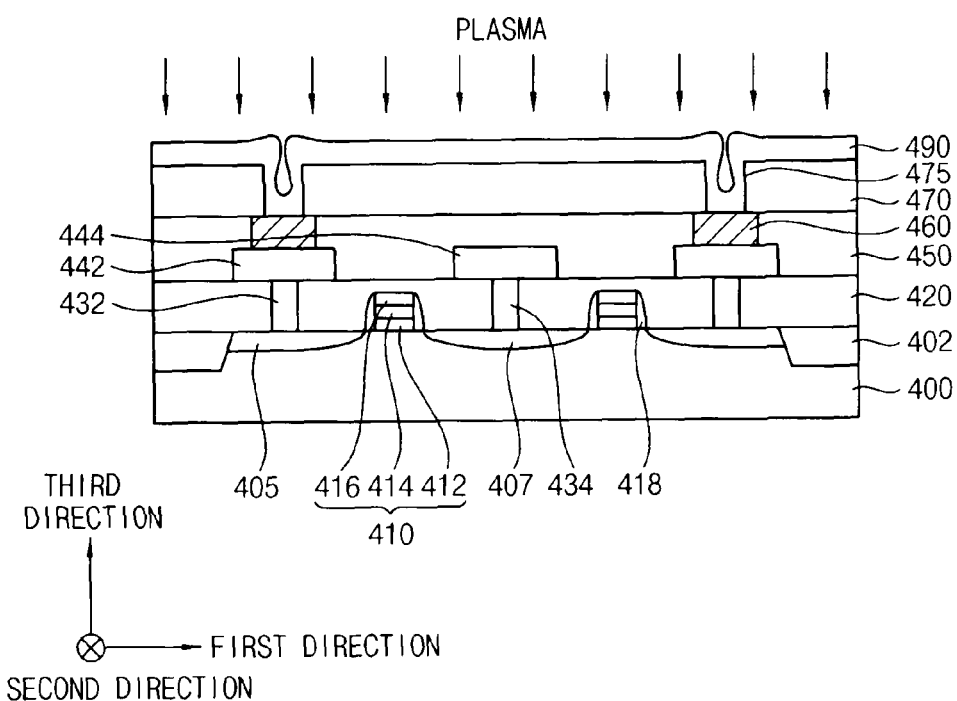

Referring to FIG. 20, a plasma treatment process is performed on the phase change material layer 490 to remove the oxide layer 495. The plasma treatment process may include an RF plasma treatment process, using hydrogen and an inert gas, such as Ar, Ne, Ke or Xe, for example. In exemplary embodiments, the RF plasma treatment process may be performed using an RF bias below about 300W and a plasma power of about 100W to about 600W. For example, the RF plasma treatment process may be performed using hydrogen gas and argon gas under a pressure of about 1 mTorr to about 100 mTorr.

Figure 21:
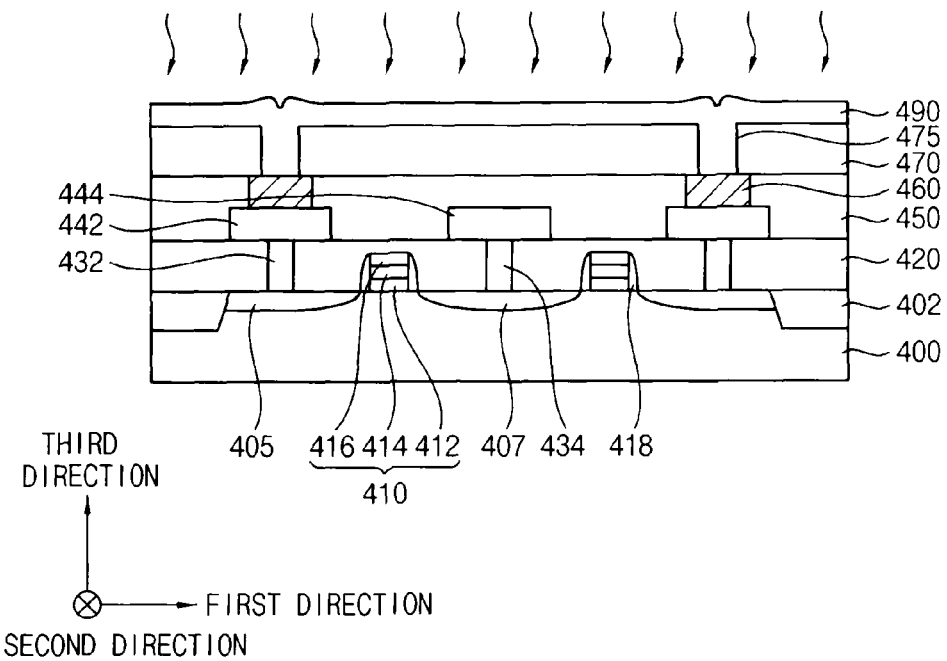

Referring to FIG. 21, the void or seam in the phase change material layer 490 is removed by a heat treatment process, so that the phase change material layer 490 sufficiently fills the second opening 475. In the absence of the oxide layer 495, heat is efficiently and uniformly distributed to the phase change material layer 490 during the heat treatment process. Therefore, the void or seam in the second opening 475 is easily removed by evaporation and condensation of the phase change material layer 490 on the surface thereof. The heat treatment process may be performed using hydrogen and an inert gas, such as He, Ar, Ne, Kr, Xe, or the like, at a pressure of about 0.1 torr to about 10 torr and a temperature of about 300° C. to about 400° C.

In exemplary embodiments, after the plasma treatment process, the substrate 400 may be transferred from the deposition chamber into the heat treatment chamber in a high vacuum state, for example, at a pressure below $10^{-7}$ Torr. The heat treatment process is then performed on the phase change material layer 490 in the heat treatment chamber. Therefore, additional formation of a natural oxide layer, caused by reaction between the phase change material layer 490 and oxygen in the air and/or the chambers, is prevented.

Figure 22:
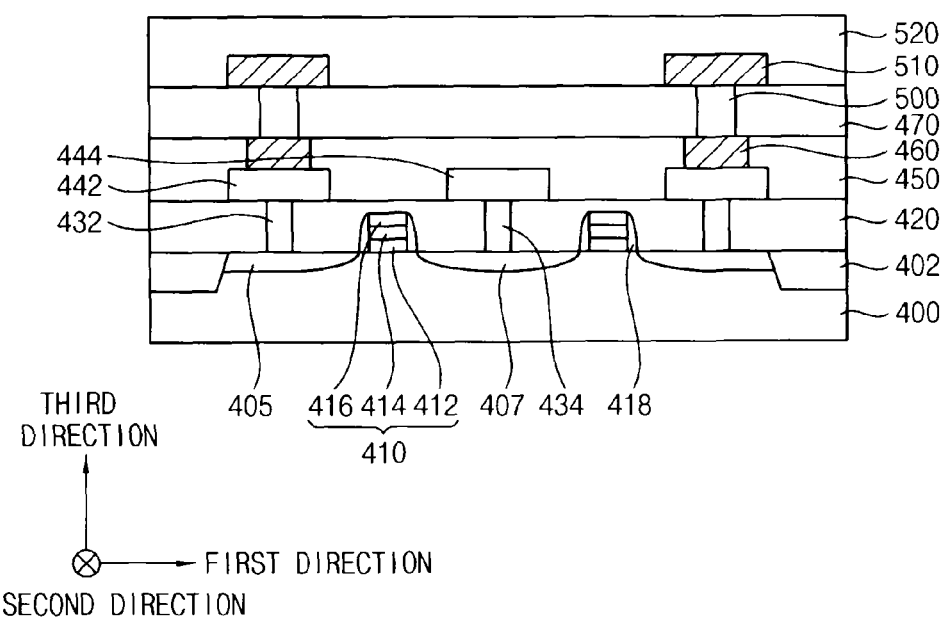

Referring to FIG. 22, the phase change material layer 490 is planarized until a top surface of the third insulating interlayer 470 is exposed, so that a phase change material pattern 500 is formed. The planarization process may include a CMP process or an etch-back process, for example.

An upper electrode layer is formed on the first insulating interlayer 470 and the phase change material layer pattern 500. The upper electrode layer is patterned to form an upper electrode 510. Multiple upper electrodes 510 are spaced apart in the first direction, and may have a linear shape extending in the second direction, for example.

A heat dissipation preventive layer (not shown) and/or a barrier layer (not shown) may be further formed between the phase change material layer pattern 500 and the upper electrode 510. In exemplary embodiments, the heat dissipation preventive layer may be formed using silicon nitride, silicon oxide, or the like, for example. When the phase change material layer pattern 500 is heated, the heat dissipation preventive layer generally prevents heat dissipation from the phase change material layer pattern 500. The barrier layer may be formed using titanium, tantalum, molybdenum, tungsten, chrome, niobium, or aluminum, for example. The barrier layer generally prevents diffusion of material between the phase change material layer pattern 500 and the upper electrode 510.

A fourth insulating interlayer 520 is formed on the third insulating interlayer 470 to cover the upper electrode 510. The fourth insulating interlayer 520 may be formed by an oxide, a nitride and/or an oxy-nitride using a CVD process, a PVD process, or an ALD process, for example.

Figure 23:
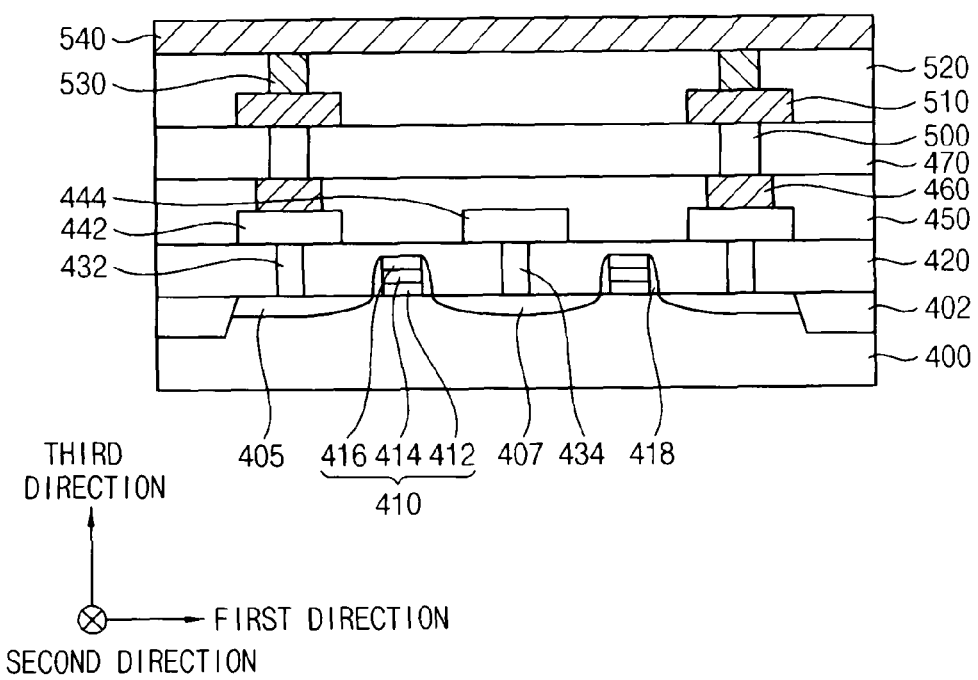

Referring to FIG. 23, an upper contact hole (not shown) is formed in the fourth insulating interlayer 520 to expose the upper electrode 510. An upper contact 530 filling the upper contact hole is formed to contact the upper electrode 510.

Second wiring 540 extending in the first direction is formed on the fourth insulating interlayer 520 to contact the upper contact 530. The upper contact 530 and the second wiring 540 may be formed by a metal, a conductive metal nitride or polysilicon doped with impurities, for example. The upper contact 530 and the second wiring 540 may be formed using a CVD process, a sputtering process, an ALD process, an electron beam evaporation process, or a pulsed laser deposition process, for example. The phase change memory device may thus be manufactured by performing the afore-mentioned processes.

While the inventive concept has been described with reference to exemplary embodiments, it will be apparent to those skilled in the art that various changes and modifications may be made without departing from the spirit and scope of the present invention. That is, it should be understood that the above embodiments are not limiting, but illustrative. Although a few exemplary embodiments have been described, those skilled in the art will readily appreciate that modifications are possible in the exemplary embodiments without materially departing from the novel teachings and advantages of the present inventive concept.

What is claimed is:

1. A method of forming a phase change material layer pattern, comprising:

forming a phase change material layer on an insulating interlayer having an opening therein, in a process by which phase change material is formed in part of the opening, and wherein a native oxide is produced at a surface of the phase change material layer;

removing the native oxide by performing a plasma treatment process on the phase change material layer; and performing a heat treatment process that comprises heating the phase change material layer, with the oxide having been removed from the surface thereof, to remove any void or a seam in the phase change material layer, such that the phase change material layer fills the opening more completely.

2. The method of claim 1, wherein the phase change material layer is maintained at a pressure below about $10^{-7}$ Torr between the plasma treatment process and the heat treatment process, preventing formation of another oxide layer on the phase change material layer.

3. The method of claim 2, wherein the plasma treatment process is performed in a different chamber than the heat treatment process is performed.

4. The method of claim 2, wherein the plasma treatment process and the heat treatment process are performed in the same chamber.

5. The method of claim 1, wherein the plasma treatment process is performed using at least one gas selected from the group consisting of hydrogen (H), argon (Ar), neon (Ne), krypton (Kr) and xenon (Xe).

6. The method of claim 1, wherein the heat treatment process is performed using at least one gas selected from the group consisting of hydrogen (H), helium (He), argon (Ar), neon (Ne), krypton (Kr) and xenon (Xe) under a pressure of about 0.1 Torr to about 10 Torr.

7. The method of claim 1, wherein the heat treatment process is performed at a temperature of about 300° C. to about 400° C.

8. The method of claim 1, wherein the phase change material layer comprises at least one material selected from the group consisting of tellurium (Te), selenium (Se), germanium (Ge), stibium (Sb), bismuth (Bi), lead (Pb), tin (Sn), arsenic (As), indium (In), sulfur (S), oxygen (O), palladium (Pd), platinum (Pt) and gold (Au), such that the oxide formed at the surface of the phase change material layer is an oxide of said material.

9. The method of claim 8, wherein the phase change material layer is doped with at least one selected from the group consisting of carbon (C), nitrogen (N), silicon (Si), oxygen (O), bismuth (Bi) and tin (Sn).

10. The method of claim 1, further comprising:
planarizing an upper portion of the phase change material layer, using a top surface of the insulating interlayer as a polishing endpoint, after performing the heat treatment process.

11. A method of manufacturing a phase change memory device, comprising:
forming a lower electrode on a substrate in a deposition chamber;
forming an insulation layer on the substrate, the insulation layer having an opening exposing a top surface of the lower electrode;
forming a phase change material layer on the exposed top surface of the lower electrode, the phase change material layer partially filling the opening;
transferring the substrate from the deposition chamber to a heat treatment chamber during all of which time the pressure of the ambient surrounding the substrate is below about $10^{-7}$ Torr;
performing a heat treatment process on the phase change material layer in the heat treatment chamber to remove a void or a seam in the phase change material layer such that the phase change material layer fills the opening more completely; and
forming an upper electrode on the phase change material layer.

12. The method of claim 11, further comprising:
forming a diode on the substrate prior to forming the lower electrode, the lower electrode being electrically connected to the diode.

13. The method of claim 11, further comprising:
forming a transistor on the substrate prior to forming the lower electrode, the lower electrode being electrically connected to the transistor.

14. The method of claim 11, further comprising:
forming a bit line electrically connected to the upper electrode; and
forming a word line electrically connected to the lower electrode.

15. The method of claim 11, further comprising:
performing a plasma treatment process on the phase change material layer after forming the phase change material layer, the plasma treatment process removing an oxide layer on a surface of the phase change material layer.

16. A method of fabricating a phase change memory device, the method comprising:
forming a phase change material layer on an electrode exposed by an opening in an insulating interlayer, in a process by which the phase change material layer leaves at least one void or has a seam therein in the opening and wherein a native oxide is produced at a top surface of the phase change material layer;
performing a plasma treatment process on the phase change material layer to remove the oxide from the top surface of the phase change material layer; and
performing a heat treatment process on the phase change material layer at a temperature of about 300° C. to about 400° C. while phase change material of the phase change material layer is exposed due to the plasma treatment process, and wherein the heat treatment process shrinks the at least one void or the seam in the phase change material layer.

17. The method of claim 16, further comprising:
maintaining the phase change material layer at a pressure below about $10^{-7}$ Torr between performing the plasma treatment process and the heat treatment process to prevent formation of another oxide layer at the top surface of the phase change material layer.

18. The method of claim 17, further comprising:
transferring the phase change material layer from a deposition chamber in which the plasma treatment process is performed into a heat treatment chamber in which the heat treatment process is performed.

19. The method of claim 17, wherein the plasma treatment process comprises radio frequency (RF) plasma treatment using hydrogen (H) gas and an inert gas under a pressure of about 1 mTorr to about 100 mTorr.

20. The method of claim 16, further comprising:
planarizing the top surface of the phase change material layer, exposing a top surface of the insulating interlayer to form a phase change material layer pattern.

21. The method of claim 1, wherein the process of forming the phase change material layer forms at least one void or a seam in the phase change material, the native oxide is produced at a surface of the phase change material that delimits the void or the seam such that the native oxide is located between the void or seam and the phase change material, and the performing of the plasma treatment process includes removing the native oxide from between the surface of the phase change material and the void or the seam.

22. The method of claim 16, wherein the top surface of the phase change material layer at which the native oxide is formed includes a surface that delimits the void or the seam such that the native oxide is located between the void or seam and the phase change material of said layer, and the performing of the plasma treatment process includes removing the native oxide from between the phase change material and the void or the seam.

* * * * *